US008476645B2

(12) United States Patent
McDaniel et al.

(10) Patent No.: US 8,476,645 B2
(45) Date of Patent: Jul. 2, 2013

(54) LED THERMAL MANAGEMENT

(75) Inventors: Gary A. McDaniel, Santa Cruz, CA (US); Chip Akins, San Jose, CA (US)

(73) Assignee: Uni-Light LLC, San Jose, CA (US)

( * ) Notice: Subject to any disclaimer, the term of this patent is extended or adjusted under 35 U.S.C. 154(b) by 141 days.

(21) Appl. No.: 12/945,052

(22) Filed: Nov. 12, 2010

(65) Prior Publication Data

US 2011/0278629 A1 Nov. 17, 2011

Related U.S. Application Data

(60) Provisional application No. 61/261,003, filed on Nov. 13, 2009.

(51) Int. Cl.
*H01L 27/15* (2006.01)
*H01L 31/12* (2006.01)
*H01L 33/00* (2010.01)

(52) U.S. Cl.
USPC ............. 257/79; 257/706; 257/762; 257/771; 257/E21.053; 257/E21.077; 257/E21.324; 257/E21.352

(58) Field of Classification Search
USPC ................. 257/15, 79, 88, 98, 622, 633, 706, 257/762, 771, E33.001, E21.053, E21.077, 257/E21.324, E21.352
See application file for complete search history.

(56) References Cited

U.S. PATENT DOCUMENTS

| | | | | |
|---|---|---|---|---|
| 5,317,344 | A | 5/1994 | Beaman et al. | |
| 5,785,418 | A | 7/1998 | Hochstein | |
| 5,800,905 | A | 9/1998 | Sheridan et al. | |
| 6,045,240 | A * | 4/2000 | Hochstein | 362/294 |
| 6,278,613 | B1 | 8/2001 | Fernandez et al. | |
| 6,339,875 | B1 | 1/2002 | Larson | |
| 6,392,888 | B1 | 5/2002 | Chen et al. | |
| 6,758,263 | B2 * | 7/2004 | Krassowski et al. | 165/185 |
| 6,864,571 | B2 | 3/2005 | Arik et al. | |
| 7,061,104 | B2 | 6/2006 | Kenny, Jr. et al. | |
| 7,198,386 | B2 | 4/2007 | Zampini et al. | |
| 7,202,505 | B2 | 4/2007 | Nurminen et al. | |
| 7,244,965 | B2 | 7/2007 | Andrews et al. | |
| 7,303,005 | B2 * | 12/2007 | Reis et al. | 165/185 |
| 7,345,320 | B2 | 3/2008 | Dahm | |
| 7,439,618 | B2 | 10/2008 | Sir et al. | |
| 7,456,499 | B2 | 11/2008 | Loh et al. | |
| 7,474,529 | B2 | 1/2009 | Tian et al. | |
| 2004/0126913 | A1 * | 7/2004 | Loh | 438/26 |
| 2004/0184272 | A1 | 9/2004 | Wright et al. | |
| 2005/0024834 | A1 | 2/2005 | Newby | |
| 2005/0083698 | A1 | 4/2005 | Zampini et al. | |
| 2005/0161682 | A1 | 7/2005 | Mazzochette et al. | |
| 2005/0174544 | A1 | 8/2005 | Mazzochette | |
| 2006/0020308 | A1 | 1/2006 | Muldner | |
| 2006/0180821 | A1 | 8/2006 | Fan et al. | |
| 2006/0198149 | A1 | 9/2006 | Jonsson et al. | |
| 2006/0275732 | A1 | 12/2006 | Cao | |

(Continued)

*Primary Examiner* — David Nhu
(74) *Attorney, Agent, or Firm* — Kilpatrick Townsend & Stockton LLP

(57) ABSTRACT

Thermal management solutions for higher power LEDs. In accordance with embodiments, a heat sink, preferably copper, is connected directly to the thermal pad of an LED. Directly connecting the LED thermal pad to the copper heat sink reduces the thermal resistance between the LED package and the heat sink, and more efficiently conducts heat away from the LED through the copper heat sink. In embodiments, the copper heat sink is directly soldered to the LED thermal pad.

20 Claims, 4 Drawing Sheets

U.S. PATENT DOCUMENTS

| | | | |
|---|---|---|---|
| 2006/0286358 | A1 | 12/2006 | Tower |
| 2006/0289887 | A1 | 12/2006 | Bui et al. |
| 2007/0099325 | A1 | 5/2007 | Park |
| 2008/0035938 | A1 | 2/2008 | Mazzochette |
| 2008/0232129 | A1 | 9/2008 | Lyons |
| 2008/0258168 | A1 | 10/2008 | Loh et al. |
| 2009/0039368 | A1 | 2/2009 | Omae |
| 2009/0080187 | A1 | 3/2009 | Chou |
| 2009/0086474 | A1 | 4/2009 | Chou |

* cited by examiner

LED THERMAL MANAGEMENT

CROSS-REFERENCES TO RELATED APPLICATIONS

The present application claims priority of U.S. Provisional Patent Application No. 61/261,003 , filed Nov. 13, 2009, the full disclosure of which is incorporated herein by reference.

BACKGROUND

Due to improved luminescent efficiencies and extended lifetime, high power light-emitting diodes (LEDs) are a good option for replacing other technologies such as incandescent and fluorescent bulbs. One of the main advantages provided by an LED is its efficiency. When compared to traditional lighting systems, a much higher percentage of an LED's input current goes to the generation of light, as opposed to the generation of heat.

Nonetheless, a higher power LED generates heat that must be dissipated during use. Heat accompanied by higher power not only causes inefficiencies, but also influences long-term reliability of LED devices. Consequently, thermal management of high power LEDs is extremely crucial for proper operation and extended life.

One prior art method of providing thermal management is to solder a LED package to the front of a circuit board, and to provide thermal vias, typically copper, that extend from the front of the circuit board to a heat sink positioned behind the board. Another prior method is taught in U.S. Patent Application No. US20060289887A1, where a back plane is connected to a thermal pad, and a heat sink is connected to the back plane.

DESCRIPTION OF THE BACKGROUND ART

The following references may describe relevant background art: U.S. Patent Application Nos. US20090080187A1; US20090086474A1; US20080035938A1; US20080258168A1; US20080232129A1; US20070099325A1; US20060275732A1; US20060020308A1; US20050024834A1; US20060289887A1; US20050161682A1; US20050174544A1; US20060180821A1; US20040184272A1 US2004012691A1; and US20060198149A1; and U.S. Pat. Nos. 7,474,520; 7,456,499; 7,439,618; 7,345,320; 7,244,965; 7,202,505; 7,198,386; 7,061,104; 6,864,571; 6,339,875; 6,278,613; 6,045,240; 5,800,905; 5,785,418; and 5,317,344.

BRIEF SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

Embodiments herein present thermal management solutions for higher power LEDs. In accordance with embodiments, a heat sink, preferably copper, is connected directly to the thermal pad of an LED. Directly connecting the LED thermal pad to the copper heat sink reduces the thermal resistance between the LED package and the heat sink, and more efficiently conducts heat away from the LED through the copper heat sink. In embodiments, the copper heat sink is soldered to the LED thermal pad.

In an embodiment, a very thin circuit board or flex circuit provides the required electrical connections to an LED package. The LED package thermal pad is affixed to the thin circuit board or flex circuit and is suspended over an opening in the circuit board, for example by the LED leads, with the thermal pad exposed at a back side of the board or circuit. The heat sink is then connected directly to the thermal pad through the opening.

In another embodiment, an LED package is mounted over an opening in a circuit board, and a feature on the heat sink extends upward through the opening and attaches directly to the thermal pad of the LED package. In this embodiment, the LED package may be mounted so that it is not exposed to the back of the circuit board, and the feature extends upward to engage the thermal pad.

In embodiments, the copper heat sink is attached directly to the thermal pad, and an opposite side or location of the copper heat sink is attached to an additional heat dissipating structure, such as an aluminum block, and together the copper heat sink and aluminum block dissipate heat. In such an embodiment, the copper heat sink efficiently removes heat away from the thermal pad and distributes that heat over a greater surface area, permitting a structure with a lower thermal conductivity (e.g., aluminum) to dissipate the distributed heat.

For a fuller understanding of the nature and advantages of the present invention, reference should be made to the ensuing detailed description and accompanying drawings.

DETAILED DESCRIPTION

In the following description, various embodiments of the present invention will be described. For purposes of explanation, specific configurations and details are set forth in order to provide a thorough understanding of the embodiments. However, it will also be apparent to one skilled in the art that the present invention may be practiced without the specific details. Furthermore, well-known features may be omitted or simplified in order not to obscure the embodiment being described.

The present invention relates to thermal management solutions for LEDs. The thermal management solutions allow higher power LEDs to be used in lighting fixtures by affixing the thermal pad of the LED directly to a heat sink, preferably a copper heat sink.

Standard heat sink materials, including aluminum, have a higher thermal resistance than copper. Copper is almost twice as efficient as aluminum as a thermal conductor, with a heat transfer coefficient of 401 for copper, compared to 250 for aluminum. Embodiments herein preferably utilize copper as a heat sink, and preferably attach the copper directly to a thermal pad on the LED package. By "copper", we mean pure copper or a copper alloy that functions, from a thermal conductivity perspective, like copper. That is, the alloy presents relatively high thermal conductivity, especially with respect to aluminum.

In embodiments, the thermal pad of the LED package is connected directly to the copper heat sink, without an intervening layer of thermal resistance. Thus, the copper heat sink greatly improves heat removal from the thermal pad of the LED.

The thermal pad of the LED package can be affixed directly to the copper heat sink using solder with a low thermal resistance. As an example, the solder can include high silver content, which conducts heat very well and has low thermal resistance.

Figure 1:
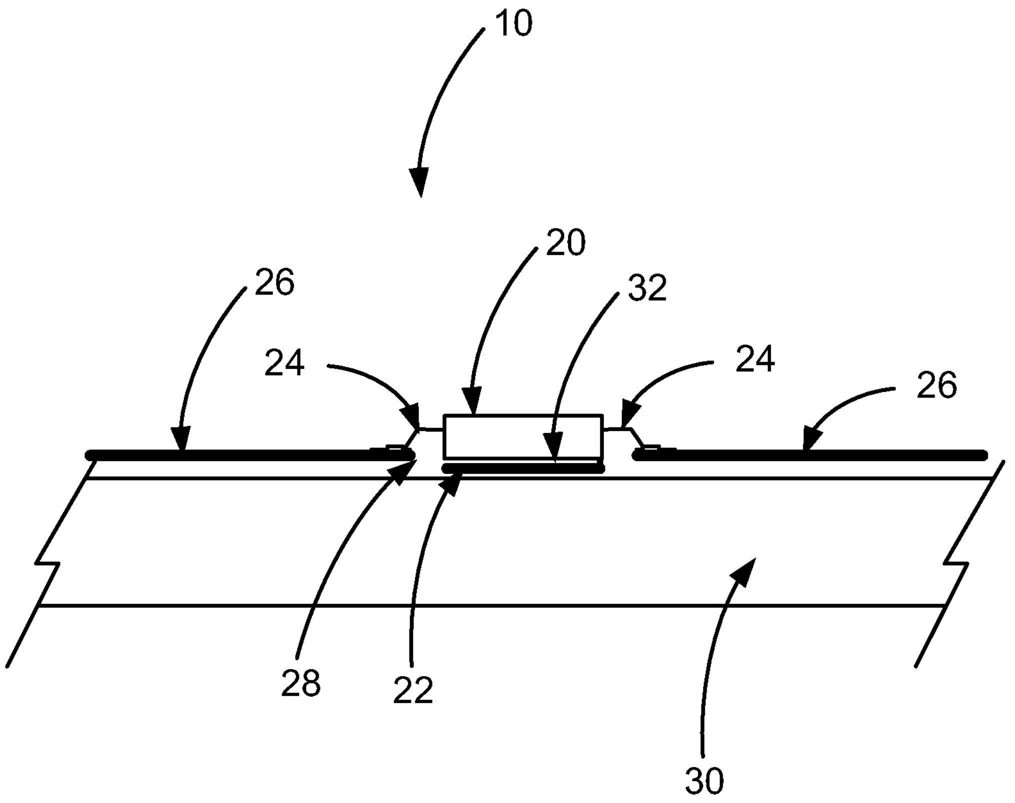
FIG. 1 is a diagrammatic representation of a circuit board and LED package combination in accordance with an embodiment.

FIG. 1 shows a system 10 with a combination circuit board, LED package, and cooling structure in accordance with an embodiment. In the embodiment shown in the drawings, a LED package 20 having a thermal pad 22 on a lower side is connected by LED leads 24 to a flex circuit or thin circuit board 26. The LED leads 24 suspend the LED package 20 in an opening 28 in the flex circuit or thin circuit board 26.

In the embodiment shown in FIG. 1, the thermal pad 22 is aligned in a coplanar manner with the back of the circuit board 26. In this manner, a flat heat sink 30 may be attached along the back of the circuit board 26 and to the back of the thermal pad 22. Light generated from the LED package 20 emanates from the front side of the circuit board 26, with the heat sink 20 positioned on the back. A heat sink 30 is attached directly to the thermal pad 22, for example by solder 32. As described above, the heat sink 30 is preferably formed of copper, and the solder 32 may be, for example, a silver solder.

The thin circuit board or flex circuit 26 provides the required electrical connections to the LED package 20 via the LED leads 24. The thin circuit board or flex circuit 26 delivers the required current to the LED package 20 so that the LED on the package may generate sufficient light output. The LED inherently generates heat in the process. The thermal pad 22 of the LED is affixed to the copper heat sink 30, which removes heat from the LED package. The heat sink may be sized in accordance with desired heat dissipation and an application.

An external current control could be used to regulate the current to LEDs. Similarly an external voltage and current limiting resistor could be used.

In order to construct the system in FIG. 1, a manufacturer designs and fabricates the copper heat sink 30 with spatial and cooling requirements and constraints in mind. The manufacturer also designs the circuit board or flex circuit 26 with a suitable cutout or opening 28 in which to suspend the thermal pad 22 of the LED package 20.

The copper heat sink 30 may then be attached to the thermal pad 22, for example by soldering.

Figure 2:
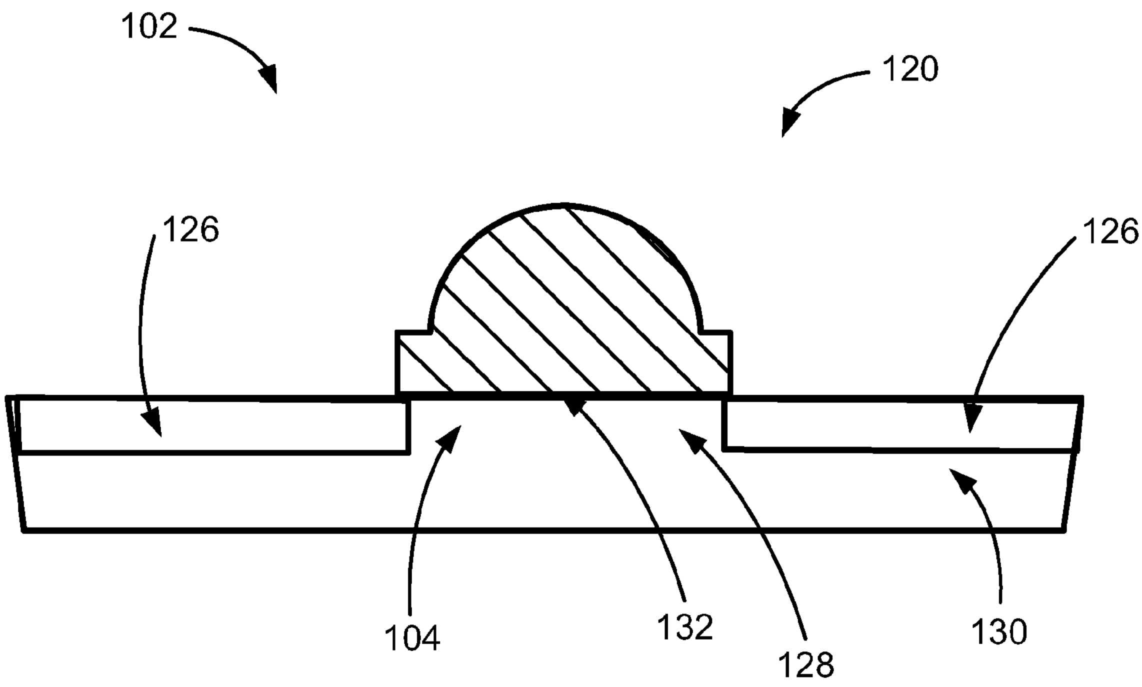
FIG. 2 is a diagrammatic representation of a cross section of an LED package and heat sink attached to a circuit board in accordance with an embodiment.

FIG. 2 shows an alternate embodiment of a system 102 including a LED package, thermal management system, and circuit board. In FIG. 2, a LED package 120 is attached to a circuit board 126. Like the circuit board 26, the circuit board 126 includes an opening 128 exposing a thermal pad 132 of the LED package 120. However, unlike the flex circuit or thin circuit board 26, the circuit board 126 is thicker in design and the LED package 120 rides mostly on top of the circuit board, and the thermal pad 132 is not exposed out of or along the bottom of the circuit board 126, but instead is inset in the opening 128.

To permit direct attachment of a heat sink 130 to the thermal pad 132, the heat sink 130 includes a raised boss 104 that extends above a top surface of the heat sink. This raised boss 104 may be formed, for example, by a punching process, machining or otherwise cold working the metal, or casting, as examples.

The raised boss of 104 permits the heat sink 130 to extend along the back side of the circuit board 126 and the boss 104 to directly engage the thermal pad 132.

In embodiments, a copper heat sink, such as the copper heat sink 130, may be formed of more than one piece of copper. As an example, the raised boss 104 may be formed of a single piece of copper, with the rest of the heat sink formed as a separate piece. After the raised boss 104 is soldered to the thermal pad 132, the remainder of the heat sink may be attached to the raised boss, for example by press fitting the two together, otherwise forming a mechanical attachment, soldering or gluing the pieces together, or another attachment method.

Figure 4:
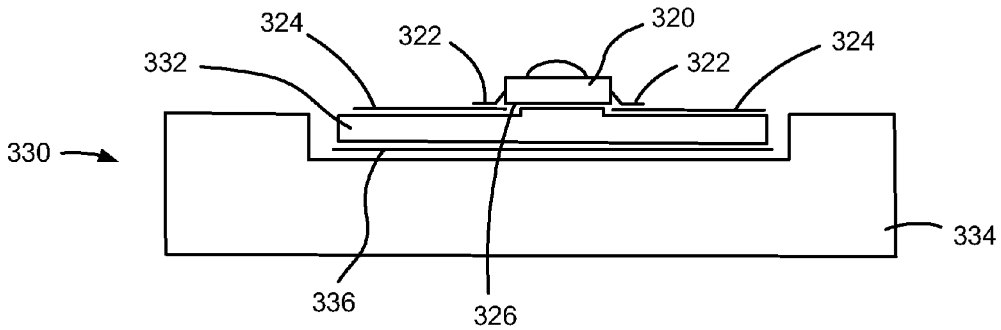
FIG. 4 is a diagrammatic representation of a cross section of an LED package and two piece heat sink in accordance with embodiments.

Another example is shown in FIG. 4, where a LED package 320 is mounted on a heat sink 330 having LED pins 322 soldered to a circuit board 324. The thermal pad 326 of the LED package 320 is connected to a two-piece heat sink 330. A first piece 332, made of copper, is connected directly to the thermal pad 326. A second piece 334, made of another thermally conductive material, such as aluminum, is connected to the first piece. In the embodiment shown in the drawing, the first and second pieces are connected by adhesion, preferably a thermally conductive adhesive, such as a Kapton film 336 having adhesive on both sides. This Kapton film 336 serves to attach the copper portion (i.e., the first piece 332) of the heat sink to the aluminum portion, both mechanically and thermally. Moreover, the Kapton film 336 it also provides 6 KV of electrical insulation for passing electrical isolation regulatory requirements like UL and CE.

Other arrangements may be used. For example, as described above and below, the two pieces may be connected in a variety of different ways. The aluminum is recessed in FIG. 4, but that is not a requirement for all embodiments. Larger lights can have multiple copper plates in a single, large aluminum heat sink, sometimes arranged on flat aluminum, sometimes convex or concave depending on the lighting coverage and glare avoidance requirements.

Using two or more pieces in this manner makes soldering to the thermal pad easier, because during soldering, the entirety of the copper piece being soldered needs to be heated to soldering temperature. Using a small piece that is soldered directly to the thermal pad, and mechanically attaching that small piece to a larger piece permits soldering to take place with less heating, thus saving energy and manufacturing time.

Figure 3:
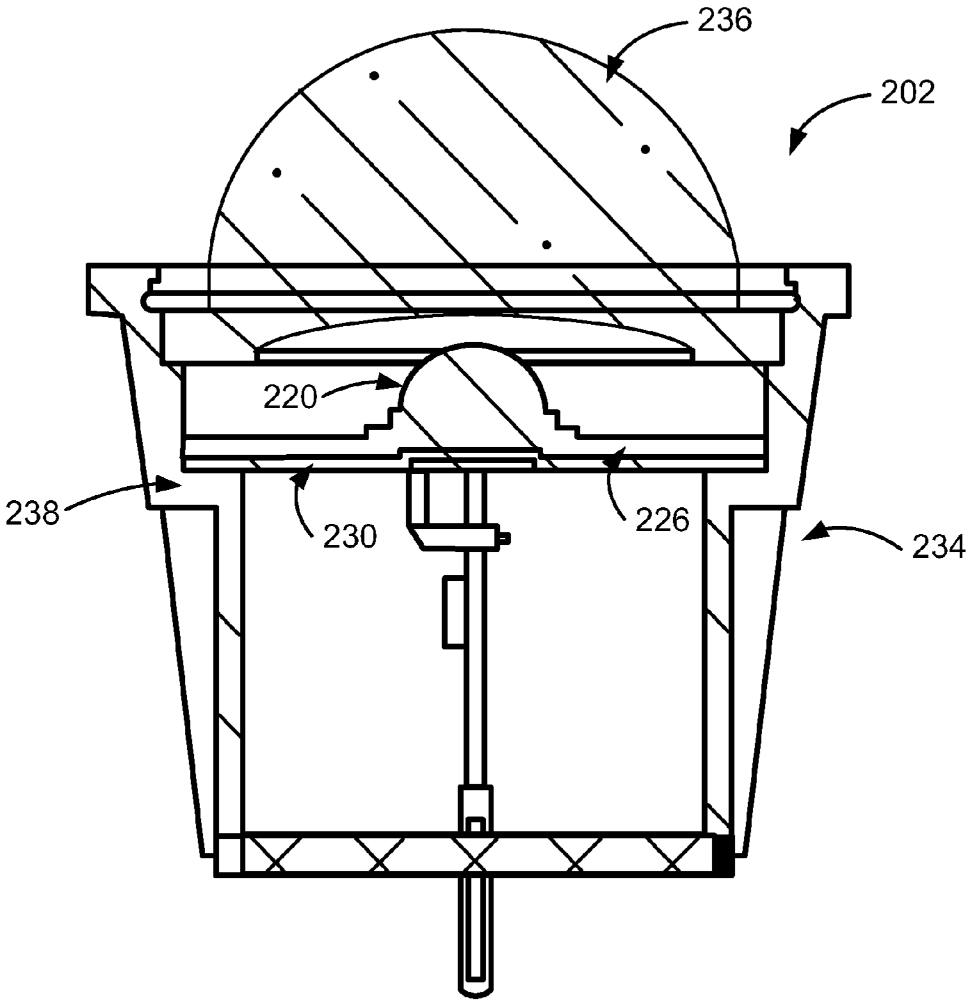
FIG. 3 is a diagrammatic representation of a cross section of a light fixture incorporating a LED package and heat sink cooling structure in accordance with an embodiment.

FIG. 3 shows yet another embodiment of s system 202 including a combined LED package 220, thermal management system 234, and circuit board 226. In the embodiment shown in FIG. 3, the LED package 220 is mounted to a thin heat sink 230, for example in the manner shown in FIG. 2. This heat sink 230 may be, for example, in the shape of a thin circular disk with a boss as described above. In the embodiment shown, the heat sink 230 is part of the thermal management system 234, along with a thermally conductive body 238. In the embodiment shown in the drawings, the thermally conductive body 238 is shaped similar to the shape of a light bulb, for example as a cylinder, and includes a globe 236 mounted at a top portion. The heat conductive body 238 may be formed of a less expensive material than the heat sink 230 and a material that is less thermally conductive than copper, such as aluminum.

The combined copper heat sink 230 and aluminum heat conductive body 238 provide an advantageous combination. First, the copper heat sink 230 efficiently moves heat away from the LED package 220. Thus, the surface available for heat dissipation is greater than the thermal pad provided by the LED package 230. The copper in the heat sink 230 efficiently removes the heat from the LED package 230, and the heat conductive body 238 is available to further remove and dissipate the heat. The heat conductive body 238 is designed to conduct heat, but may be formed of a less expensive heat conductive material, such as aluminum. The two pieces may be mechanically connected, for example by press fitting, thermal adhesives, or in other manners.

The embodiment of FIG. 3 provides the advantages of the structures of FIGS. 1 and 2 in that a copper heat sink is directly connected to a thermal pad of an LED package. In addition, less expensive materials may be used for the heat conductive structure 238 while still providing adequate heat dispersion and dissipation.

Using copper heat sinks for LED lighting provides better thermal properties than aluminum. Affixing the thermal pad of an LED package directly to the copper heat sink provides dramatically better thermal conductivity than alternate methods. Applicants have found that, utilizing the features described herein results in an additional 5 to 10, or 20 to 40 degrees Celsius per Watt of thermal loss; that is, heat that is being dissipated compared to the prior art methods described above. Specifically, the structures and methods described herein provide an additional 5 to 10 degrees Celsius per Watt of thermal loss over the structure in U.S. Patent Application No. US20060289887A1, and an additional 20 to 40 degrees Celsius per Watt of thermal loss over the via structure described in the background section.

This invention allows higher light output from LED lighting fixtures. It can be used to design higher performance LED lights for most applications.

Such an invention could be used not only for LED packages, but also in many applications where electronic components have integral thermal pads.

Other variations are within the spirit of the present invention. Thus, while the invention is susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A light-emitting diode (LED) package and thermal management system, comprising:

a circuit board or flex circuit having an opening therein;

an LED package comprising a thermal pad, the LED package mounted to the circuit board or flex circuit with the thermal pad exposed by way of the opening; and a heat sink directly connected to the thermal pad via solder, at least one of the heat sink, the solder, or the thermal pad extending at least partially through the opening.

2. The LED package and thermal management system of claim 1, wherein the heat sink comprises copper.

3. The LED package and thermal management system of claim 2, wherein the heat sink is soldered directly to the thermal pad.

4. The LED package and thermal management system of claim 3, wherein the solder is silver based.

5. The LED package and thermal management system of claim 2, wherein the heat sink comprises first and second pieces, the first being soldered directly to the thermal pad, and the second piece being connected to the first piece.

6. The LED package and thermal management system of claim 5, wherein the first piece and second piece each comprise copper.

7. The LED package and thermal management system of claim 6, wherein the first and second pieces are press fit together.

8. The LED package and thermal management system of claim 5, wherein the first piece comprises copper, and the second piece comprises aluminum.

9. The LED package and thermal management system of claim 1, wherein the heat sink comprises a raised surface that extends through the opening.

10. The LED package and thermal management system of claim 9, wherein the heat sink comprises a base that extends against a back surface of the circuit board or a flex circuit.

11. The LED package and thermal management system of claim 1, wherein the heat sink consists essentially of copper.

12. The LED package and thermal management system of claim 11, wherein the heat sink is soldered directly to the thermal pad.

13. The LED package and thermal management system of claim 12, wherein the solder is silver based.

14. The LED package and thermal management system of claim 11, wherein the heat sink comprises first and second pieces, the first being soldered directly to the thermal pad, and the second piece being connected to the first piece.

15. The LED package and thermal management system of claim 14, wherein the first piece and second piece each comprise copper.

16. The LED package and thermal management system of claim 15, wherein the first and second pieces are press fit together.

17. The LED package and thermal management system of claim 14, wherein the first piece comprises copper, and the second piece comprises aluminum.

18. The LED package and thermal management system of claim 1, wherein:

the LED package further comprises LED leads connecting the LED package to the circuit board or flex circuit; and the thermal pad is configured to transmit heat from the LED package separate from the LED leads.

19. A light-emitting diode (LED) package and thermal management system, comprising:

a circuit board or flex circuit having an opening therein;

an LED package comprising a thermal pad, the LED package mounted to the circuit board or flex circuit with the thermal pad exposed at the opening; and a heat sink directly connected to the thermal pad, the heat sink comprising first and second pieces, the first piece being soldered directly to the thermal pad, and the second piece being connected to the first piece.

20. The LED package and thermal management system of claim 19, wherein the first piece comprises copper and the second piece comprises aluminum.

* * * * *